(12) United States Patent
Chen et al.

(10) Patent No.: US 9,660,218 B2
(45) Date of Patent: May 23, 2017

(54) PACKAGE OF ENVIRONMENTAL SENSITIVE ELEMENT

(71) Applicant: Industrial Technology Research Institute, Hsinchu (TW)

(72) Inventors: Kuang-Jung Chen, Hsinchu County (TW); Yi-Hao Peng, Taipei (TW); Hsin-Yuan Su, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/948,394

(22) Filed: Nov. 23, 2015

(65) Prior Publication Data

US 2016/0087242 A1    Mar. 24, 2016

Related U.S. Application Data

(60) Continuation-in-part of application No. 14/730,253, filed on Jun. 4, 2015, now Pat. No. 9,224,700, which
(Continued)

(30) Foreign Application Priority Data

Sep. 15, 2009    (TW) ............................... 98131092 A

(51) Int. Cl.
*H01L 51/52*    (2006.01)
*H01L 51/00*    (2006.01)
(Continued)

(52) U.S. Cl.
CPC ...... *H01L 51/5256* (2013.01); *H01L 51/0097* (2013.01); *H01L 51/5253* (2013.01);
(Continued)

(58) Field of Classification Search
CPC ......... H01L 23/02; H01L 23/28; H01L 23/58; H01L 51/00; H01L 51/40; H01L 51/50; H01L 51/52; B32B 7/02
(Continued)

(56) References Cited

U.S. PATENT DOCUMENTS 4,818,782 A * 4/1989 Bissot ..................... B32B 27/20
                                                  524/413
4,916,025 A * 4/1990 Lu .......................... B29C 55/026
                                                  428/516
(Continued)

FOREIGN PATENT DOCUMENTS

CN    1851925      10/2006
TW    201251000    12/2012
(Continued)

OTHER PUBLICATIONS

J. Granstrom, et al., "Encapsulation of organic light-emitting devices using a perfluorinated polymer," Applied Physics Letters, vol. 93, Nov. 2008, pp. 193304-1-193304-3.
Thomas Kinkeldei, et al., "Encapsulation for Flexible Electronic Devices," IEEE Electron Device Letters, vol. 32, No. 12, Dec. 2011, pp. 1743-1745.

*Primary Examiner* — Xiaoliang Chen
(74) *Attorney, Agent, or Firm* — Jianq Chyun IP Office

(57) ABSTRACT

In one embodiment, a package of an environmental sensitive element including a flexible substrate, an environmental sensitive element and an encapsulation is provided. The environmental sensitive element is disposed on the flexible substrate. The encapsulation covers the environmental sensitive element, wherein the Young's mudulus of the encapsulation ranges from about 5 GPa to about 15 GPa, hardness of the encapsulation ranges from about 0.4 GPa to about 1.0 GPa, and water vapor transmittance rate (WVTR) of the encapsulation is less than $10^{-2}$ g/cm² day.

7 Claims, 10 Drawing Sheets

Related U.S. Application Data is a division of application No. 13/867,136, filed on Apr. 22, 2013, now Pat. No. 9,101,005, which is a continuation-in-part of application No. 12/703,155, filed on Feb. 9, 2010, now Pat. No. 8,446,730.

(51) Int. Cl.
  *H01L 23/00* (2006.01)
  *H01L 23/24* (2006.01)
  *H01L 23/31* (2006.01)

(52) U.S. Cl.
  CPC .......... *H01L 23/24* (2013.01); *H01L 23/3121* (2013.01); *H01L 23/562* (2013.01); *H01L 23/564* (2013.01); *H01L 51/5246* (2013.01); *H01L 2251/5338* (2013.01); *H01L 2251/55* (2013.01); *H01L 2924/0002* (2013.01); *Y02E 10/549* (2013.01)

(58) Field of Classification Search
  USPC ........ 257/100, 40, 642, 678; 428/1.31, 35.7, 428/172, 213, 217, 447, 458, 483; 359/883; 313/512
  See application file for complete search history.

(56) References Cited

U.S. PATENT DOCUMENTS

| | | | | |
|---|---|---|---|---|
| 4,983,432 | A * | 1/1991 | Bissot | B32B 27/20 428/324 |
| 5,302,442 | A * | 4/1994 | O'Brien | B32B 27/32 428/213 |
| 5,855,994 | A | 1/1999 | Biebuyck et al. | |
| 6,224,947 | B1 * | 5/2001 | Hall | B05D 7/142 427/309 |
| 6,402,606 | B1 * | 6/2002 | Kusakabe | B24D 3/28 451/541 |
| 6,407,191 | B1 * | 6/2002 | Mezquita | C08F 10/02 524/272 |
| 6,419,966 | B1 * | 7/2002 | Davis | B32B 27/32 426/106 |
| 6,451,895 | B1 * | 9/2002 | Topolkaraev | C08J 3/203 501/141 |
| 6,522,067 | B1 * | 2/2003 | Graff | H01L 51/5256 313/504 |
| 6,624,568 | B2 | 9/2003 | Silvernail | |
| 6,969,556 | B2 * | 11/2005 | Jeschke | C08J 5/18 264/173.15 |
| 6,984,698 | B2 * | 1/2006 | McLeod | C08J 5/18 525/333.8 |
| 7,115,320 | B2 * | 10/2006 | Tanaka | B32B 27/08 428/337 |
| 7,128,631 | B2 * | 10/2006 | McCoy | B82Y 30/00 430/198 |
| 7,351,478 | B2 * | 4/2008 | Hanyu | B32B 27/32 428/349 |
| 8,349,116 | B1 | 1/2013 | Bibl et al. | |
| 8,598,786 | B1 | 12/2013 | Kim et al. | |
| 9,493,348 | B2 * | 11/2016 | Ramadas | B82Y 30/00 |
| 2002/0042490 | A1 * | 4/2002 | McLeod | C08J 5/18 526/348.1 |
| 2002/0125822 | A1 * | 9/2002 | Graff | H01L 51/5256 313/506 |
| 2003/0042562 | A1 | 3/2003 | Giebeler et al. | |
| 2003/0048074 | A1 | 3/2003 | Ni et al. | |
| 2003/0172458 | A1 * | 9/2003 | Bonfanti | A47G 9/007 5/490 |
| 2003/0199657 | A1 * | 10/2003 | Davis | B32B 27/32 526/348.1 |
| 2004/0150332 | A1 | 8/2004 | Hwang et al. | |
| 2004/0197944 | A1 | 10/2004 | Chen et al. | |
| 2005/0058792 | A1 * | 3/2005 | Iwatsubo | B32B 27/32 428/35.7 |
| 2005/0139974 | A1 * | 6/2005 | Huang | H01L 23/4334 257/678 |
| 2005/0145909 | A1 | 7/2005 | Giebeler et al. | |
| 2005/0179379 | A1 | 8/2005 | Kim | |
| 2005/0285519 | A1 | 12/2005 | Cok | |
| 2005/0285520 | A1 | 12/2005 | Cok | |
| 2006/0006798 | A1 | 1/2006 | Buckley | |
| 2006/0155028 | A1 * | 7/2006 | Lee | C08L 23/0815 524/386 |
| 2006/0269782 | A1 | 11/2006 | Liao et al. | |
| 2007/0023870 | A1 * | 2/2007 | Dubois | C08L 101/12 257/642 |
| 2007/0036960 | A1 * | 2/2007 | Lambert | C08J 5/18 428/220 |
| 2007/0049155 | A1 | 3/2007 | Moro et al. | |
| 2007/0115572 | A1 * | 5/2007 | Van Dam | G02F 1/133305 359/883 |
| 2007/0116932 | A1 * | 5/2007 | Van Der Tempel | G02F 1/133305 428/172 |
| 2007/0152212 | A1 * | 7/2007 | Cho | H01L 51/5256 257/40 |
| 2007/0172685 | A1 * | 7/2007 | Kapur | B32B 27/00 428/523 |
| 2007/0241674 | A1 | 10/2007 | Chao et al. | |
| 2007/0269616 | A1 * | 11/2007 | Nakano | G02B 5/3033 428/1.31 |
| 2007/0285777 | A1 * | 12/2007 | Toyoshima | G02B 1/105 359/487.05 |
| 2007/0298231 | A1 * | 12/2007 | Ito | B32B 27/00 428/213 |
| 2008/0012477 | A1 | 1/2008 | Koo et al. | |
| 2008/0032146 | A1 * | 2/2008 | Toyoshima | B32B 27/08 428/483 |
| 2008/0259576 | A1 | 10/2008 | Johnson et al. | |
| 2009/0021157 | A1 * | 1/2009 | Kim | H01L 51/5284 313/504 |
| 2009/0035545 | A1 * | 2/2009 | Guenther | B32B 27/32 428/219 |
| 2009/0036580 | A1 * | 2/2009 | Qian | C08L 23/06 524/261 |
| 2009/0066244 | A1 * | 3/2009 | Tassini | H01L 51/524 313/512 |
| 2009/0072734 | A1 | 3/2009 | Harada et al. | |
| 2009/0181303 | A1 * | 7/2009 | Neudecker | H01M 2/0212 429/209 |
| 2009/0202747 | A1 * | 8/2009 | Yukinobu | H01B 1/20 428/1.1 |
| 2009/0258237 | A1 * | 10/2009 | Choi | H01L 23/291 428/447 |
| 2010/0068514 | A1 * | 3/2010 | Ellinger | C09J 153/02 428/351 |
| 2010/0089636 | A1 * | 4/2010 | Ramadas | B82Y 15/00 174/521 |
| 2010/0238383 | A1 * | 9/2010 | Nakano | G02B 5/3033 349/96 |
| 2010/0304048 | A1 * | 12/2010 | Yukinobu | C08J 7/045 428/1.1 |
| 2011/0063808 | A1 | 3/2011 | Chen et al. | |
| 2011/0151173 | A1 * | 6/2011 | Ramadas | C23C 14/0073 428/76 |
| 2012/0024722 | A1 | 2/2012 | Chen | |
| 2012/0064278 | A1 | 3/2012 | Chen | |
| 2014/0070187 | A1 | 3/2014 | Cho et al. | |

FOREIGN PATENT DOCUMENTS

| | | |
|---|---|---|
| TW | I407535 | 9/2013 |
| TW | 201423978 | 6/2014 |

\* cited by examiner

PACKAGE OF ENVIRONMENTAL SENSITIVE ELEMENT

CROSS-REFERENCE TO RELATED APPLICATION

This application is a continuation-in-part application of U.S. application Ser. No. 14/730,253, filed on Jun. 4, 2015, now allowed, which is a divisional application of U.S. application Ser. No. 13/867,136, filed on Apr. 22, 2013, U.S. Pat. No. 9,101,005. The prior U.S. application Ser. No. 13/867,136 application is a continuation-in-part application of and claims the priority benefit of U.S. application Ser. No. 12/703,155, filed on Feb. 9, 2010, U.S. Pat. No. 8,446,730, which claims the priority benefit of Taiwan application serial no. 98131092, filed on Sep. 15, 2009. All the prior U.S. applications are allowed. The entirety of each of the above-mentioned patent applications is hereby incorporated by reference herein and made a part of this specification.

BACKGROUND

Technical Field

The present disclosure relates to a package of an environmental sensitive element.

Description of Related Art

The flexible substrates have a wide range of applications, ease of carriage and safety. However typical flexible substrates may not entirely avoid the transmission of water vapor and oxygen, devices on these substrates experience accelerated aging. These devices having short lifespan fail to meet the commercial needs. Besides, since the flexible substrate has flexibility, when the flexible substrate is bent, the device will be damaged by bending force. The device may not normally operate. Therefore, how to improve the durability of the devices while they are bent is one of the important issues to be resolved in this field.

SUMMARY

An embodiment of the present disclosure provides a package of an environmental sensitive element, wherein the package includes a flexible substrate, an environmental sensitive element, and an encapsulation. The environmental sensitive element is disposed on the flexible substrate. The encapsulation covers the environmental sensitive element, wherein the Young's mudulus of the encapsulation ranges from about 5 GPa to about 15 GPa, hardness of the encapsulation ranges from about 0.4 GPa to about 1.0 GPa, and water vapor transmittance rate (WVTR) of the encapsulation is less than $10^{-2}$ g/cm$^2$ day.

Another embodiment of the present disclosure provides a package of an environmental sensitive element, wherein the package includes a flexible substrate, an environmental sensitive element, a first flexible protection layer and a first packaging structure. The environmental sensitive element is disposed on the flexible substrate. The first packaging strucutre covers the environmental sensitive element. The first flexible protection layer is disposed on the first packaging structure, wherein Young's mudulus of the first flexible protection layer ranges from about 5 GPa to about 15 GPa, hardness of the first flexible protection layer ranges from about 0.4 GPa to about 1.0 GPa, and water vapor transmittance rate (WVTR) of the first flexible protection layer is less than $10^{-2}$ g/cm$^2$ day.

In order to make the aforementioned of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

First Embodiment

Figure 1A:
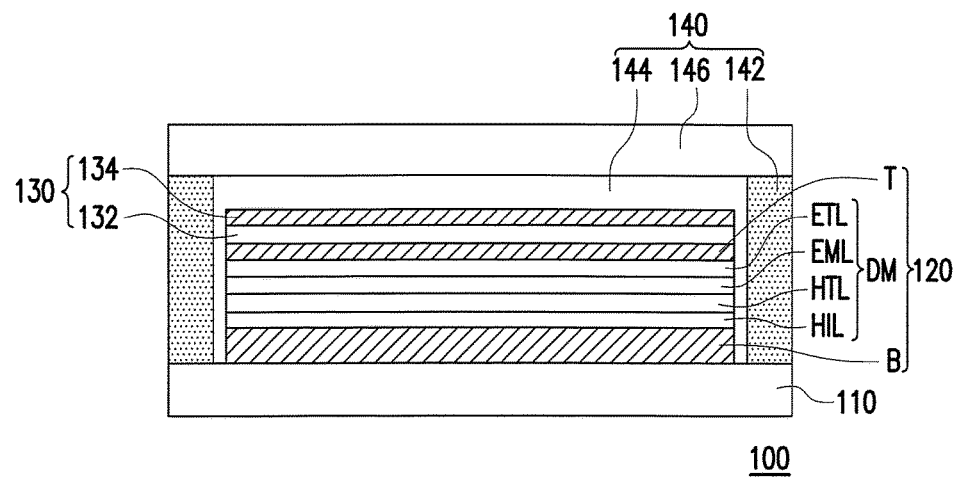
FIG. 1A, FIG. 1B, FIG. 1C and FIG. 1D are the cross-sectional views of a package of an environmental sensitive element according to the first embodiment of the present disclosure.
Figure 1B:
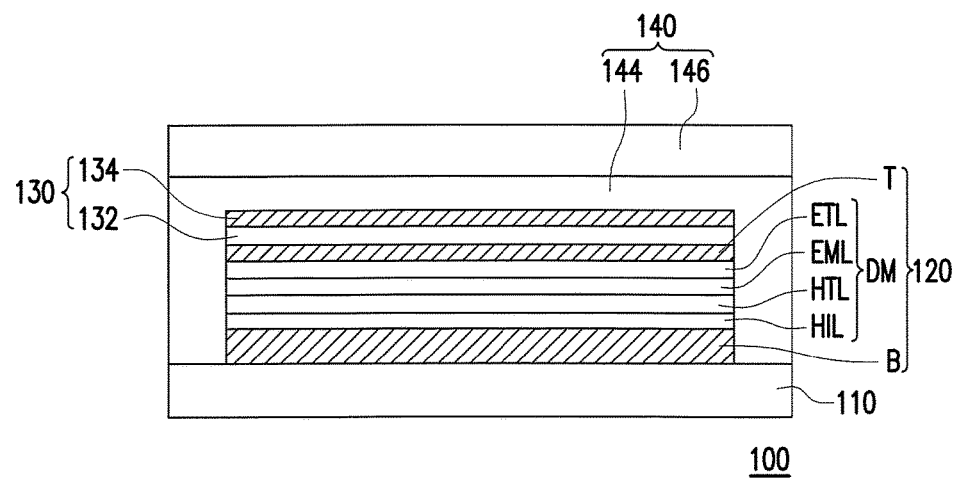

FIG. 1A and FIG. 1B are the cross-sectional views of a package of an environmental sensitive element according to the first embodiment of the present disclosure. As shown in FIG. 1A and FIG. 1B, a package 100 of an environmental sensitive element of the first embodiment includes a flexible substrate 110, an environmental sensitive element 120, an encapsulation 130 and a packaging structure 140.

The environmental sensitive element 120 is disposed on the flexible substrate 110. The encapsulation 130 is disposed on and encapsulates the environmental sensitive element 120, wherein the environmental sensitive element 120 includes a plurality of first thin films (ex. DM, B, T) and the encapsulation 130 may include a plurality of second thin films (132 and 134) which are stacked on each other. In this embodiment, the encapsulation 130 includes at least one first layer 132 and at least one second layer 134 stacked over the first layer 132, wherein Young's mudulus of the first layer 132 and the second layer 134 ranges from about 5 GPa to about 15 GPa, hardness of the first layer 132 and the second layer 134 ranges from about 0.4 GPa to about 1.0 GPa, and water vapor transmittance rate (WVTR) of the second layer 134 is less than $10^{-2}$ g/cm$^2$ day. The packaging structure 140 covers the environmental sensitive element 120 and the encapsulation 130.

In the present embodiment, material of the flexible substrate 110 can be, for example, plastic material such as PE (polyethylene), PMMA (polymethylmethacrylate), PC (polycarbonate), PI (polyimide), PVC (polyvinyl chloride), PEN (polyethylene naphthalate) or PES (polyethersulfone). Moreover, the material of the flexible substrate 110 may comprise metal foil or thin glass. In some embodiments, the flexible substrate 110 may comprise at least one gas barrier layer fromed thereon so as to enhance reliability of the package 100 of an environmental sensitive element. In addition, the encapsulation 130 may be in contact with the gas barrier layer formed on the flexible substrate 110 so as to enhance protection capability when the package 100 of an environmental sensitive element is bent.

As shown in FIG. 1A, the environmental sensitive element 120 comprises a bottom electrode layer B, a displaying medium DM and a top electrode layer T. The bottom electrode layer B is disposed on the flexible substrate 110, the displaying medium DM is disposed on bottom electrode layer B and the top electrode layer T is disposed on the displaying medium DM. For instance, the displaying medium DM may be composed of a hole injection layer HIL, a hole transporting layer HTL, an emitting layer EML and an electron transporting layer ETL. The hole injection layer HIL is disposed on the bottom electrode layer B, the hole transporting layer HTL is disposed on the hole injection layer HIL, the emitting layer EML is disposed on the hole transporting layer HTL, and the electron transporting layer ETL is disposed on the emitting layer EML. Furthermore, the top electrode layer T is disposed on the electron transporting layer ETL.

The environmental sensitive element 120 of the present embodiment may be an active matrix element or a passive matrix element. When the environmental sensitive element 120 is the active matrix element, the bottom electrode layer B can be, for example, a pixel electrode of the thin film transistor array and the top electrode layer T can be, for example, a common electrode. Meanwhile, the displaying medium DM between each of the pixel electrodes and the common electrode may be individually driven to emit lights. When the environmental sensitive element 120 is the passive matrix element, the bottom electrode layer B and the top electrode layer T may be the stripe electrodes, and the bottom electrode layer B and the top electrode layer T may be arranged in an interlacing manner. Meanwhile, the displaying medium DM may locate at the crossover section where each of the top electrode layer T interlaces the bottom electrode layer B may be individually driven to emit lights. In the present embodiment, the extending direction of the bottom electrode layer B can be, for example, substantially perpendicular to the extending direction of the top electrode layer T.

As shown in FIG. 1A, the first layer 132 of the encapsulation 130 is configured on the top electrode layer T of the environmental sensitive element 120 and the second layer 134 is configured on the first layer 132. It should be noticed that, the first layer 132 of the present embodiment is connected to the top electrode layer T, but the second layer 134 is not connected to the top electrode layer T. However, in other embodiments of the present disclosure, the second layer 134 disposed on the first layer 132 may be connected to the top electrode layer T. The first layer 132 and the second layer 134 are soft or flexible enough to absorb the bending stress so as to protect the environmental sensitive element 120 when the package of the environmental sensitive element is bent. Therefore, the first layer 132 and the second layer 134 may effectively protect the first thin films (ex. DM, B and T) from damage during the package is bent. In addition, the encapsulation 130 may have a UV cutting function so as to increase the life time of the environmental sensitve element 120. And also the encapsulation 130 may further have a light out coupling function so as to increase the light extraction efficiency of the environmental sensitve element 120. In some embodiments, the encapsulation 130 not only encapsulates the environmental sensitve element 120 but also extends to contact with the flexible substrate 110.

In the present embodiment, material of the first layer 132 may include organic small molecular compounds, organic oligomers, metal or organic-inorganic co-evaporated material formed by evaporation process. The molecular weight of the aforementioned organic small molecular material is about 10 g/mol-5000 g/mol and the organic small molecular material may include Alq3 (Tris-(8-hydroxyquinoline)aluminum), alpha-NPB (N,N'-Dis(naphthalene-1-yl)-N,N'-diphenyl-benzidine), CuPc (Phalocyanine copper complex). The molecular weight of the organic oligomers is about 500 g/mol-9000 g/mol and the organic oligomers may include Phenylene Vinylene Oligomers or Fluorene Oligomers. The molecular weight of metal or organic-inorganic co-evaporated material is about 3 g/mol~500 g/mol. More clearly, the aforementioned metal can be, for example, Al, Ag, Be, Cr, Cu, Co, Fe, Ge, Ir, In, Mo, Mn, Mg, Ni, Nb, Pb, Pd, Pt, Ru, Rh, Sn, Si, Sb, Se, Ti, Ta, Te, V, W, Zr, Zn, Mg—Ag, Al—Si, Al—Si—Cu, Au/Ge, Au—Be, Au—Ge—N, Ni—Cr, Pb—Sn or In—Sn.

In addition, material of the first layer 132 may further include a single or a plurality of aromatic tertiary amine compounds. The aromatic tertiary amine compounds may be 1,1-bis(4-di-p-tolylaminophenyl)cyclohexane, 1,1-bis(4-di-p-tolylaminophenyl)-4-phenylcyclohexane, 1,5-bis[N-(1-naphthyl)-N-phenylamino]naphthalene, 2,6-bis(di-p-tolylamino)naphthalene, 2,6-bis[di-(1-naphthyl)amino] naphthalene, 2,6-bis[N-(1-naphthyl)-N-(2-naphthyl)amino] naphthalene, 2,6-bis[N,N-di(2-naphthyl)amine]fluorene, 4-(di-p-tolylamino)-4'-[4(di-p-tolylamino)-styryl]stilbene, 4,4'-bis(diphenylamino)quadriphenyl, 4,4"-bis[N-(1-anthryl)-N-phenylamino]-p-terphenyl, 4,4'-bis[N-(1-coronenyl)-N-phenylamino]biphenyl, 4,4'-bis[N-(1-naphthyl)-N-phenylamino]biphenyl (NPB), 4,4'-bis[N-(1-naphthyl)-N-(2-naphthyl)amino]biphenyl (TNB), 4,4"-bis[N-(1-naphthyl)-N-phenylamino]p-terphenyl, 4,4'-bis[N-(2-naphthacenyl)-N-phenylamino]biphenyl, 4,4'-bis[N-(2-naphthyl)-N-phenylamino]biphenyl, 4,4'-bis[N-(2-perylenyl)-N-phenylamino]biphenyl, 4,4'-bis[N-(2-phenanthryl)-N-phenylamino]biphenyl, 4,4'-bis[N-(2- pyrenyl)-N-phenyl amino]biphenyl, 4,4'-bis[N-(3-acenaph-thenyl)-N-phenylamino]biphenyl, 4,4'-bis[N-(3-methylphenyl)-N-phenylamino]biphenyl (TPD), 4,4'-bis[N-(8-fluoranthenyl)-N-phenylamino]biphenyl, 4,4'-bis[N-(9-anthryl)-N-phenylamino]biphenyl, 4,4'-bis {N-phenyl-N-[4-(1-naphthyl)-phenyl]amino}biphenyl, 4,4'-bis[N-phenyl-N-(2-pyrenyl)amino]biphenyl, 4,4',4"-tris[(3-methylphenyl)phenylamino]triphenylamine (m-TDATA), Bis(4-dimethylamino-2-methylphenyl)-phenylmethane, N-phenylcarbazole, N,N'-bis[4-([1,1'-biphenyl]-4-ylphenylamino)phenyl]-N,N'-di-1-napbthalenyl-[1,1'-biphenyl]-4,4'-diamine, N,N'-bis[4-(di-1-naphtbalenylamino)phenyl]-N,N'-di-1-naphthalenyl-[1,1'-biphenyl]-4,4'-diamine, N,N'-bis[4-[(3-methylphenyl)phenylamino]phenyl]-N,N'-diphenyl-[1,1'-bipbenyl]-4,4'-diamine, N,N-bis[4-(diphenylamino)phenyl]-N',N'-dipheny-[1,1'-biphenyl]-4,4'-diamine, N,N'-di-1-naphthalenyl-N,N'-bis[4-(1-naphthalenylphenylamino)phenyl]-[1,1'-biphenyl]-4,4'-diamine, N,N'-di-1-naphthalenyl-N,N'-bis[4-(2-naphthalenylphenylamino)phenyl]-[1,1-biphenyl]-4,4'-diamine N,N,N-tri(p-tolyl)amine, N,N,N',N'-tetra-p-tolyl-4-4'-diaminobiphenyl, N,N,N',N'-tetraphenyl-4,4'-diaminobiphenyl, N,N,N',N'-tetra-1-naphthyl-4,4'-diaminobiphenyl, N,N,N',N'-tetra-2-naphthyl-4,4'-diaminobiphenyl, or N,N,N',N'-tetra(2-naphthyl)-4,4"-diamino-p-terphenyl formed by evaporation process.

Moreover, material of the second layer 134 comprises indium tin oxide (ITO), indium zinc oxide (IZO), aluminum doped zinc oxide (AZO), $WO_3$, $MoO_3$, $SiO_x$, $SiN_x$, $SiO_xN_y$, $Al_2O_3$, Al, Ag, Mg—Ag or Mg—Al formed by evaporation or PECVD processes. It should be noticed that the materials of the first layer 132 and the second layer 134 in the encapsulation 130 are selected from different material groups such that Young's modulus, hardness and WVTR of layers (132, 134) in the encapsulation 130 may meet the aforesaid conditions (i.e. Young's mudulus of the first layer 132 and the second layer 134 ranges from about 5 GPa to about 15 GPa, hardness of the first layer 132 and the second layer 134 ranges from about 0.4 GPa to about 1.0 GPa, and water vapor transmittance rate (WVTR) of the second layer 134 is less than $10^{-2}$ g/cm² day).

As shown in FIG. 1A, the packaging structure 140 comprises a sealant 142, an adhesion layer 144 and a flexible cover 146. The sealant 142 is disposed on the flexible substrate 110 to encircle or surround the environmental sensitive element 120 and the encapsulation 130. The adhesion layer 144 is disposed within the sealant 142 to cover the environmental sensitive element 120 and the encapsulation 130. Further, the flexible cover 146 may be connected with the sealant 142 and the adhesion layer 144.

As shown in FIG. 1B, the packaging structure 140 can also be other types of structure. For instance, the packaging structure may merely comprise an adhesion layer 144 and a flexible cover 146, wherein the adhesion layer 144 covers the environmental sensitive element 120 and the encapsulation 130, and the flexible cover 146 may be connected to the adhesion layer 144.

Figure 1C:
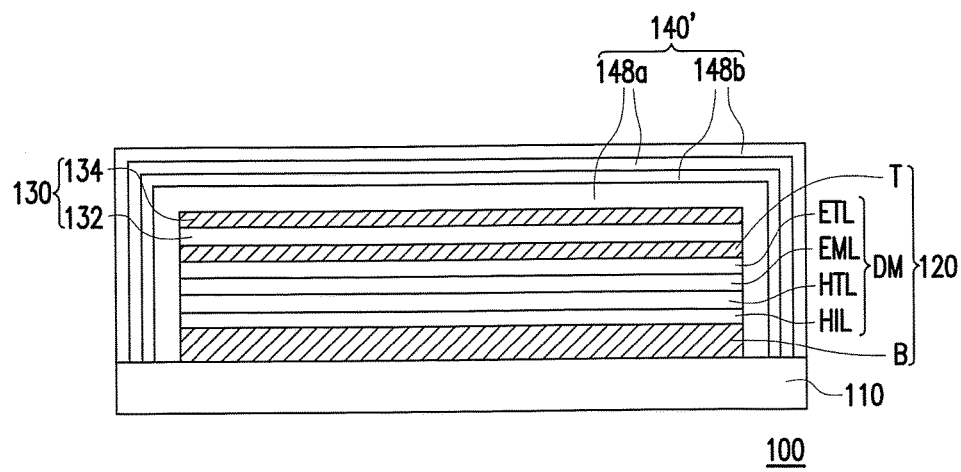

As shown in FIG. 1C, the packaging structure 140' with other packaging structure type is used in the present embodiment. For instance, the packaging structure 140' may comprise a plurality of package thin films. The package thin films include a plurality of organic package thin films 148a and a plurality of inorganic package thin films 148b. The organic package thin films 148a and the inorganic package thin films 148b are stacked on one another to provide a relatively better moisture-proof ability. For example, material of the organic package thin films 148a may be similar with that of the first layer 132 and material of the inorganic package thin films 148b may be similar with that of the second layer 134. In an embodiment, the organic package thin films 148a and the first layer 132 may have similar characteristics (Young's modulus, hardness, and WVTR) while the inorganic package thin films 148b and the second layer 134 may have similar characteristics (Young's modulus, hardness, and WVTR).

Figure 1D:
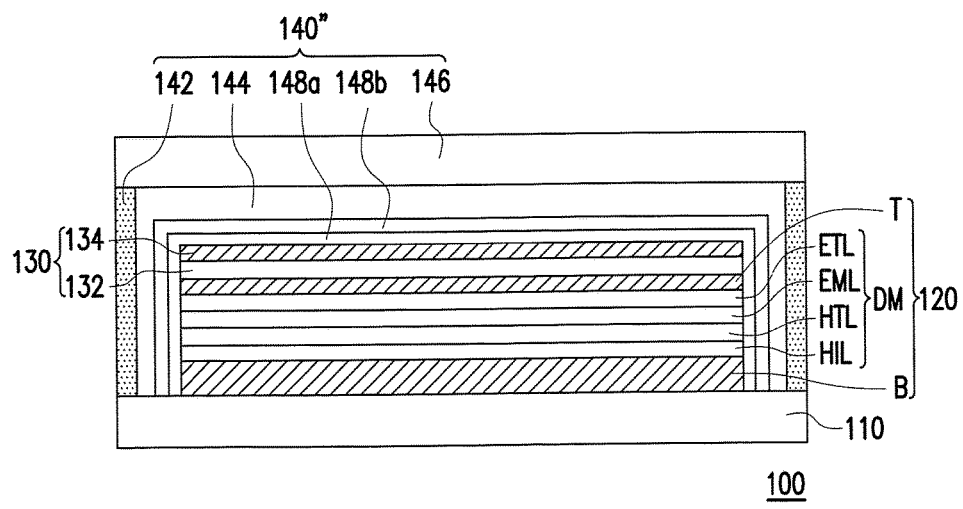

As shown in FIG. 1D, the packaging structure 140" with other packaging structure type is used in the present embodiment. For instance, the packaging structure 140" may comprise a sealant 142, an adhesion layer 144, a flexible cover 146, at least one layer of organic package thin films 148a and at least one layer of inorganic package thin films 148b. The organic package thin films 148a and the inorganic package thin films 148b are stacked on one another to provide a relatively better moisture-proof ability. The sealant 142 is disposed on the flexible substrate 110 to encircle the environmental sensitive element 120 and the encapsulation 130. The adhesion layer 144 is disposed within the sealant 142 to cover the organic package thin films 148a, the inorganic package thin films 148b and the encapsulation 130. Further, the flexible cover 146 may be connected with the sealant 142 and the adhesion layer 144.

The organic package thin films 148a and the inorganic package thin film 148b may be alternately stacked on one another.

In a present embodiment, the material of the top electrode layer T may be, for example, as same as the material of the second layer 134, and the material of the first layer 132 may be, for example, as same as the material of the hole transporting layer HTL. The process for forming the encapsulation 130 may be integrated with the process for forming the environmental sensitive element 120. In other words, the encapsulation 130 and the environmental sensitive element 120 may be manufactured in the same process chamber without further modifying the current process procedure.

Second Embodiment

Figure 2A:
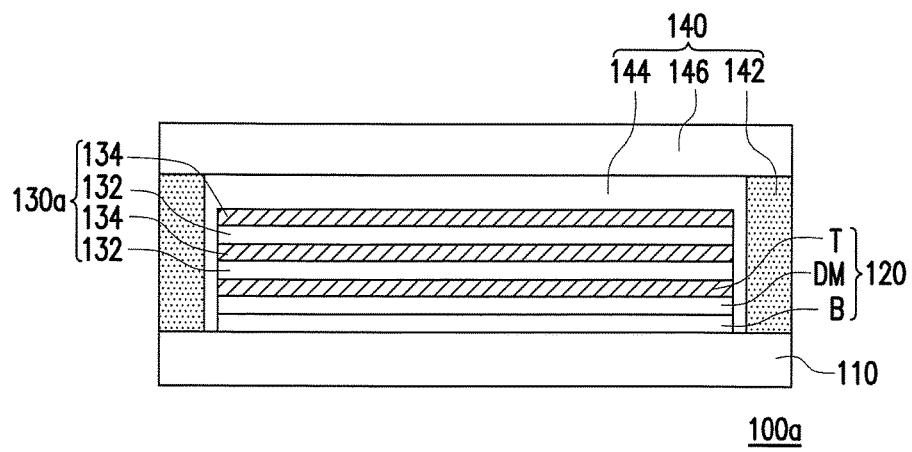
FIG. 2A and FIG. 2B are the cross-sectional views of a package of an environmental sensitive element according to the second embodiment of the present disclosure.
Figure 2B:
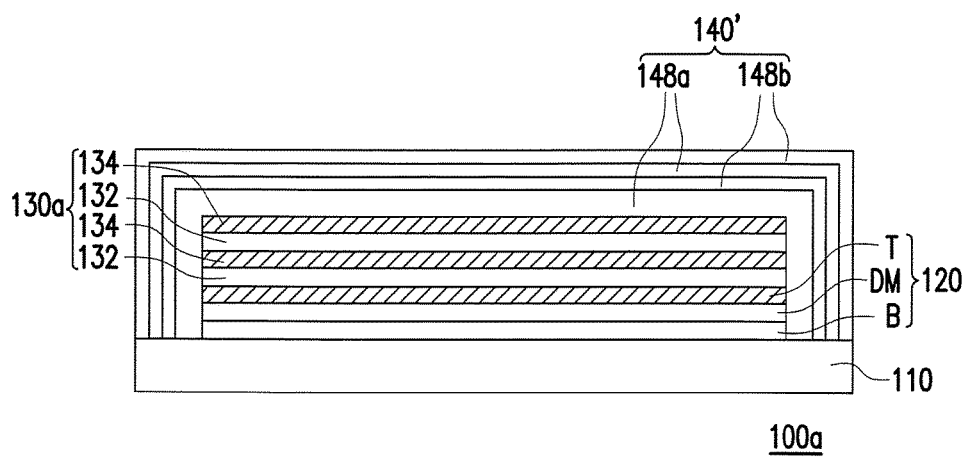

FIG. 2A and FIG. 2B are the cross-sectional views of a package of an environmental sensitive element according to the second embodiment of the present disclosure. As shown in FIG. 2A and FIG. 2B, the package 100a of the environmental sensitive element of the present embodiment is similar to the package 100 of the environmental sensitive element of the first embodiment. The encapsulation 130a of this embodiment comprises a plurality of first layer 132 and a plurality of second layer 134, wherein the first layer 132 and the second layer 134 are alternately stacked on one another and are configured on the top electrode layer T of the environmental sensitive element 120 and the bottommost first layer 132 is connected to the top electrode layer T. Moreover, the second layer 134 of the present embodiment are not connected to the top electrode layer T.

The Third Embodiment

Figure 3A:
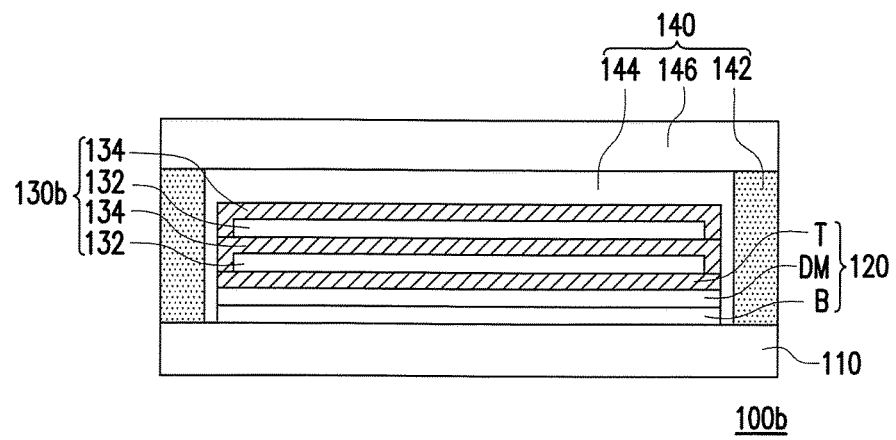
FIG. 3A and FIG. 3B are the cross-sectional views of a package of an environmental sensitive element according to the third embodiment of the present disclosure.
Figure 3B:
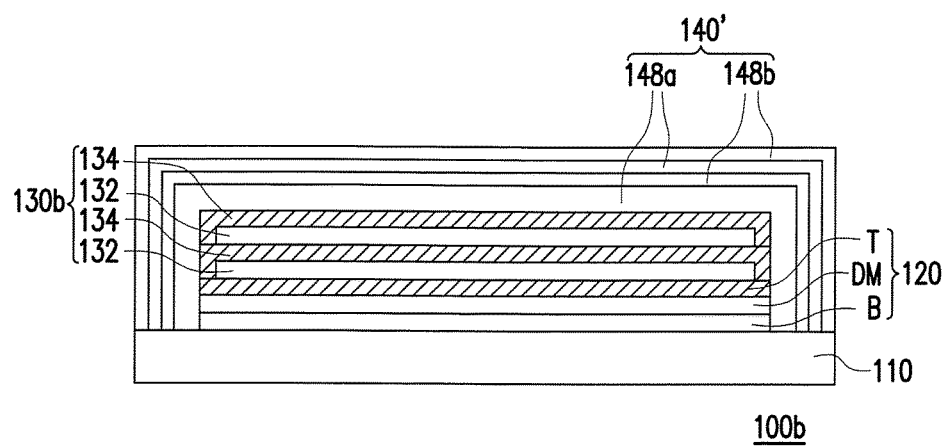

FIG. 3A and FIG. 3B are the cross-sectional views of a package of an environmental sensitive element according to the third embodiment of the present disclosure. As shown in FIG. 3A and FIG. 3B, the package 100b of the environmental sensitive element of the present embodiment is similar to the package 100a of the environmental sensitive element of the second embodiment. The encapsulation 130b comprises a plurality of first layer 132 and a plurality of second layer 134, wherein the first layer 132 and the second layer 134 are alternately stacked on one another and are configured on the top electrode layer T of the environmental sensitive element 120, wherein the bottommost first layer 132 is connected to the top electrode layer T, and each of the second layer 134 respectively covers sidewalls of the first layer 132 underneath.

It is noted that the coverage of the first layer 132 and the second layer 134 is not limited in this application. Furthermore, the detailed structure of the environmental sensitive element 120 is not limited in this application. In otherwords, the related position between the encapsulation (130, 130a, 130b) and the environmental sensitive element 120 may be properly modified in accordance with actual design requirements.

The Fourth Embodiment

Figure 4A:
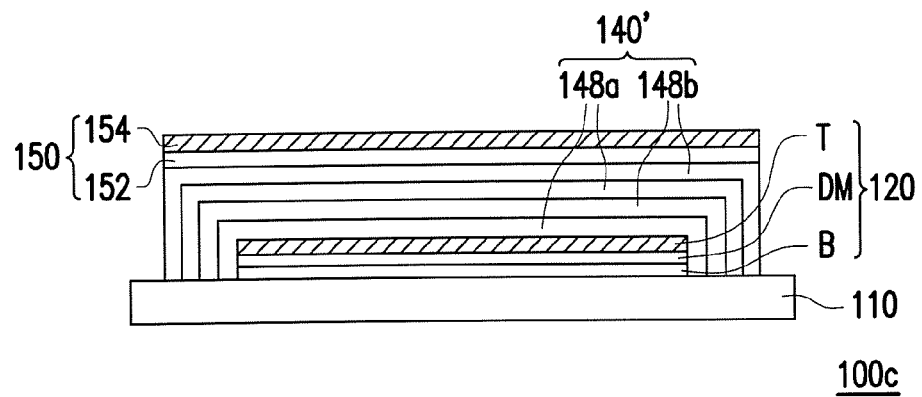
FIG. 4A is the cross-sectional view of a package of an environmental sensitive element according to the fourth embodiment of the present disclosure.
Figure 4B:
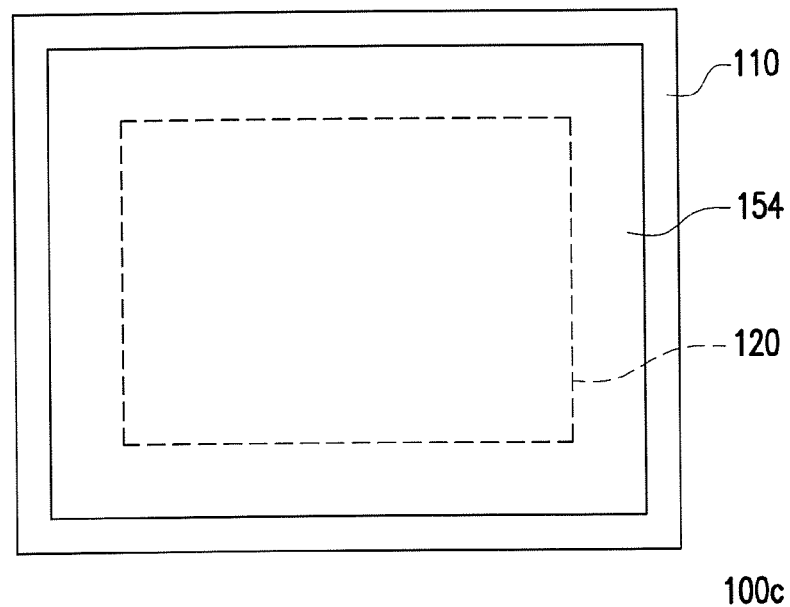
FIG. 4B is the top view of the package of the environmental sensitive element in FIG. 4A.

FIG. 4A is the cross-sectional view of a package of an environmental sensitive element according to the fourth embodiment of the present disclosure. FIG. 4B is the top view of the package of the environmental sensitive element in FIG. 4A. As shown in FIG. 4A and FIG. 4B, the package 100c of the environmental sensitive element of the present embodiment is similar to the package 100 of the environmental sensitive element of the first embodiment. The first packaging structure 140' covers the environmental sensitive element 120 and a first flexible protection layer 150 is disposed on the first packaging structure 140', wherein the environmental sensitive element 120 and the flexible protection layer 150 are located on two opposite sides of the first packaging structure 140'. The first packaging structure 140' comprises a plurality of organic package thin films 148a and a plurality of inorganic package thin films 148b. In some embodiments, the first flexible protection layer 150 may be in contact with the gas barrier layer formed on the flexible substrate 110 so as to enhance protection capability when the package 100c of an environmental sensitive element is bent.

As shown in FIG. 4A, the flexible protection layer 150 comprises a first protection thin film 152 and a second protection thin film 154, wherein the first protection thin film 152 is configured on the first packaging structure 140' and the second protection thin film 154 is configured on the first protection thin film 152. It should be noticed that, the first protection thin film 152 of the present embodiment is connected to the first packaging structure 140', but the second protection thin film 154 is not connected to the first packaging structure 140'. In other embodiments of the present disclosure, the second protection thin film 154 disposed on the first protection thin film 152 may be connected to the first packaging structure 140'. It is noted that Young's mudulus of the first protection thin film 152 and the second protection thin film 154 ranges from about 5 GPa to about 15 GPa, hardness of the first protection thin film 152 and the second protection thin film 154 ranges from about 0.4 GPa to about 1.0 GPa, and water vapor transmittance rate (WVTR) of the first protection thin film 152 or the second protection thin film 154 is less than $10^{-2}$ g/cm$^2$ day. In addition, the first flexible protection layer 150 may further have a UV cutting function so as to increase the life time of the environmental sensitve element 120. And also the first flexible protection layer 150 may further have a light out coupling function so as to increase the light extraction efficiency of the environmental sensitve element 120. In some embodiments, the first flexible protection layer 150 not only encapsulates the environmental sensitve element 120 but also extends to contact with the flexible substrate 110.

In the present embodiment, the material of the first protection thin film 152 is similar with the material of the first layer 132 (as shown in Embodiment 1), and the material of the second protection thin film 154 is similar with the material of the second layer 134 (as shown in Embodiment 1). In other words, the first protection thin film 152 and the second protection thin film 154 are soft or flexible enough to absorb the bending stress so as to protect the environmental sensitive element 120.

As shown in FIG. 4A and FIG. 4B, the dimension the first flexible protection layer 150 may be greater than the dimension of the environmental sensitive element 120 in the present embodiement. However, in other embodiments, the size of the first flexible protection layer 150 may be equal to the dimension of the environmental sensitive element 120.

The Fifth Embodiment

Figure 5A:
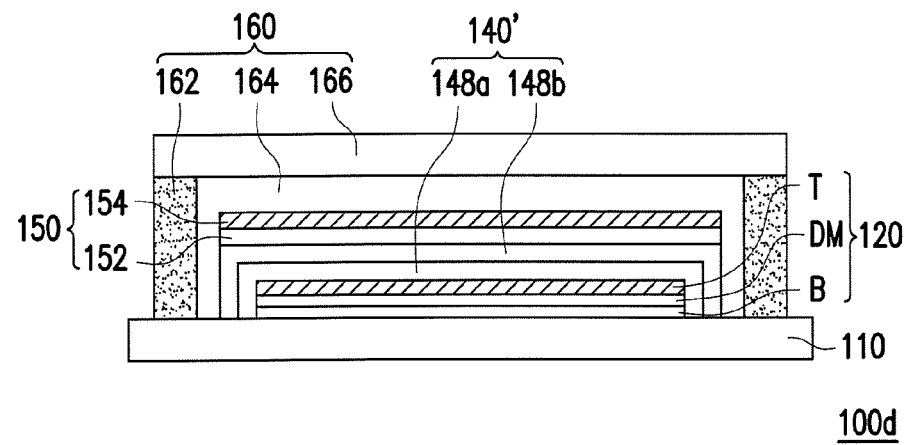
FIG. 5A is the cross-sectional view of a package of an environmental sensitive element according to the fifth embodiment of the present disclosure.
Figure 5B:
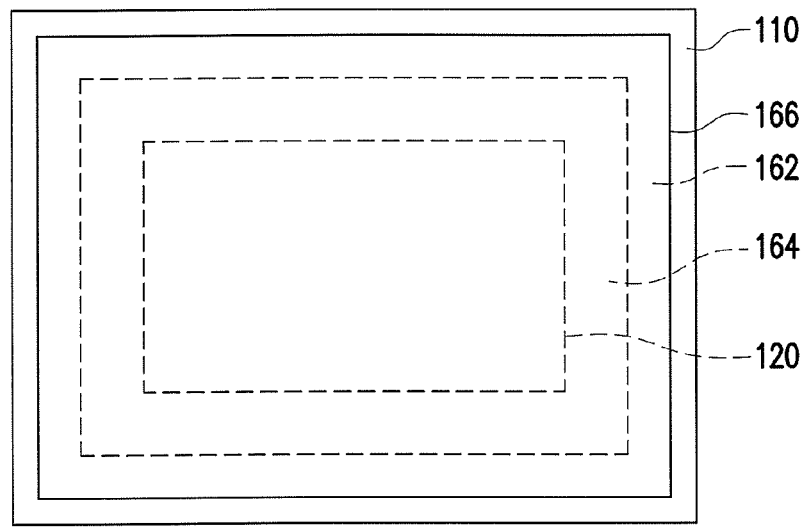
FIG. 5B is the top view of the package of the environmental sensitive element in FIG. 5A.

FIG. 5A is the cross-sectional view of a package of an environmental sensitive element according to the fifth embodiment of the present disclosure. FIG. 5B is the top view of the package of the environmental sensitive element in FIG. 5A. As shown in FIG. 5A and FIG. 5B, the package 100d of the environmental sensitive element of the present embodiment is similar to the package 100c of the environmental sensitive element of the fourth embodiment. The package 100d of the environmental sensitive element of the present embodiment further comprises a second packaging structure 160 covering the environmental sensitive element 120, the first packaging structure 140' and the first flexible protection layer 150. The second packaging structure 160 comprises a sealant 162, an adhesion layer 164 and a flexible cover 166. The sealant 162 is disposed on the flexible substrate 110 to encircle the environmental sensitive element 120 and the first flexible protection layer 150. The adhesion layer 164 is disposed within the sealant 162 to cover the environmental sensitive element 120 and the first flexible protection layer 150. Further, the flexible cover 166 may be connected with the sealant 162 and the adhesion layer 164.

As shown in FIG. 5A and FIG. 5B, the sealant 162 of the second packaging structure 160 has a continuous pattern encircling or surrounding the environmental sensitive element 120. However, in other embodiments, the sealant 162 of the second packaging structure 160 may have a non-continuous pattern encircling or surrounding the environmental sensitive element 120. For example, the sealant 162 may includes a plurality of patterns separated from each other, wherein the separated patterns are arranged in a continuous form so as to encircle or surround the environmental sensitive element 120. In addition, the material of the sealant 162 and the material of the adhesion layer 164 are different in the present embodiment. However, in other embodiments, the material of the sealant 162 and the material of the adhesion layer 164 may be the same.

The Sixth Embodiment

Figure 6A:
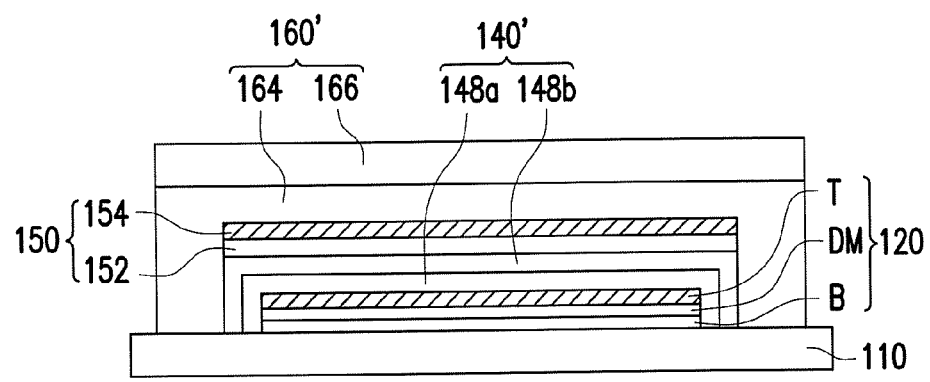
FIG. 6A is the cross-sectional view of a package of an environmental sensitive element according to the sixth embodiment of the present disclosure.
Figure 6B:
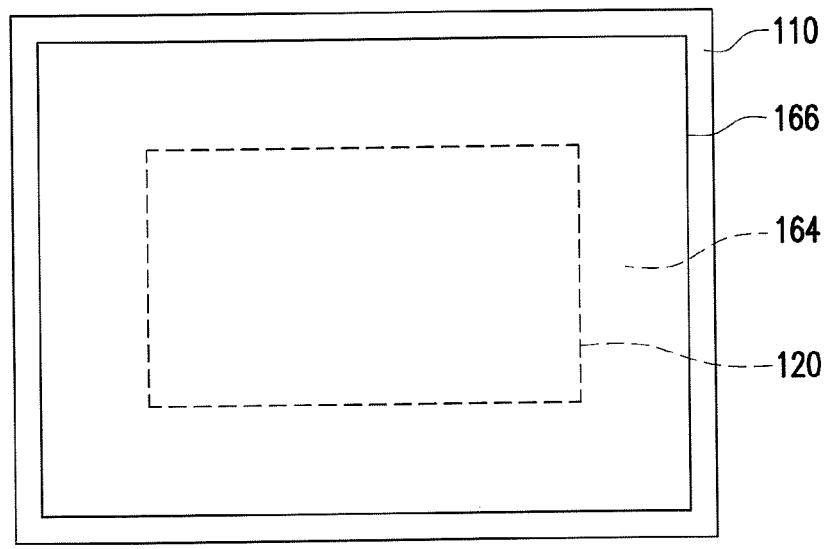
FIG. 6B is the top view of the package of the environmental sensitive element in FIG. 6A.

FIG. 6A is the cross-sectional view of a package of an environmental sensitive element according to the sixth embodiment of the present disclosure. FIG. 6B is the top view of the package of the environmental sensitive element in FIG. 6A. As shown in FIG. 6A and FIG. 6B, the package 100e of the environmental sensitive element of the present embodiment is similar to the package 100d of the environmental sensitive element of the fifth embodiment. The adhesion layer 164 of a second packaging structure 160' may be a film type adhesive. The adhesion layer 164 covers the environmental sensitive element 120 and the first flexible protection layer 150. Further, the flexible cover 166 may be connected with the adhesion layer 164.

The Seventh Embodiment

Figure 7:
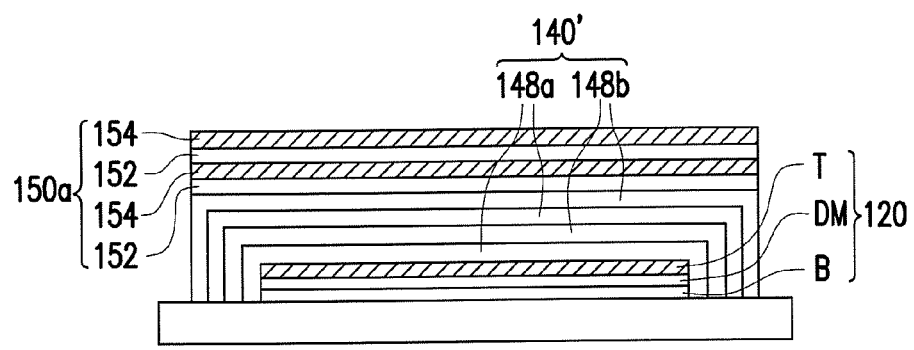
FIG. 7 is the cross-sectional view of a package of an environmental sensitive element according to the seventh embodiment of the present disclosure.

FIG. 7 is the cross-sectional view of a package of an environmental sensitive element according to the seventh embodiment of the present disclosure. As shown in FIG. 7, the package 100f of the environmental sensitive element of the present embodiment is similar to the package 100c of the environmental sensitive element of the fourth embodiment. The first flexible protection layer 150a comprises a plurality of first protection thin films 152 and a plurality of second protection thin films 154, wherein the first protection thin films 152 and the second protection thin films 154 are alternately stacked on one another and are configured on the first packaging structure 140' and the bottommost first protection thin film 152 may be connected to the first packaging structure 140'. Moreover, as shown in FIG. 7, the second flexible protecting thin films 154 of the present embodiment are not connected to the first packaging structure 140'.

The Eighth Embodiment

Figure 8:
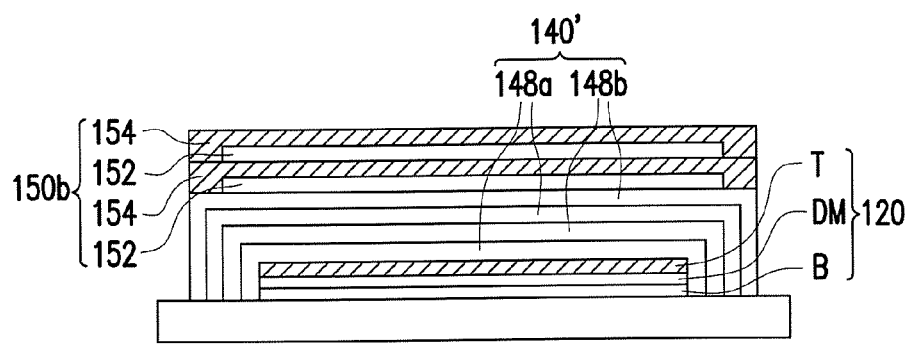
FIG. 8 is the cross-sectional view of a package of an environmental sensitive element according to the eighth embodiment of the present disclosure.

FIG. 8 is the cross-sectional view of a package of an environmental sensitive element according to the eighth embodiment of the present disclosure. As shown in FIG. 8, the package 100g of the environmental sensitive element of the present embodiment is similar to the package 100f of the environmental sensitive element in FIG. 7. The first flexible protection layer 150b comprises a plurality of first protection thin films 152 and a plurality of second protection thin films 154, wherein the first protection thin films 152 and the second protection thin films 154 are alternately stacked on one another and are configured on the first packaging structure 140'. Furthermore, the bottommost first protection thin film 152 and the bottommost second protection thin films 154 may be connected to the first packaging structure 140'.

The Ninth Embodiment

Figure 9:
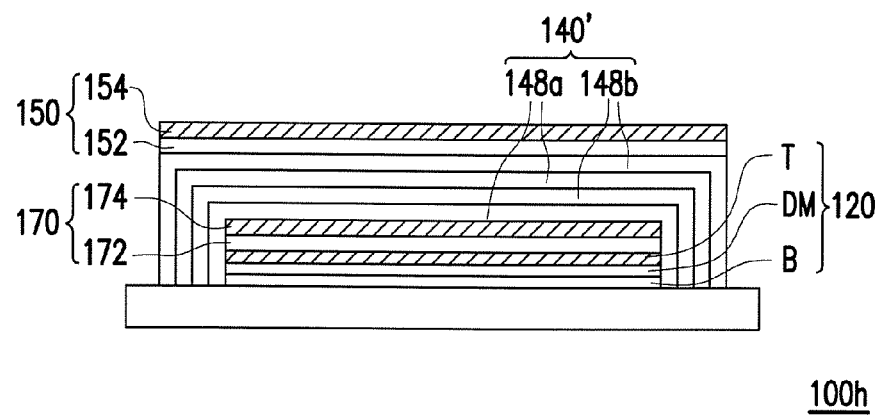
FIG. 9 is the cross-sectional view of a package of an environmental sensitive element according to the ninth embodiment of the present disclosure.

FIG. 9 is the cross-sectional view of a package of an environmental sensitive element according to the ninth embodiment of the present disclosure. As shown in FIG. 9, the package 100h of the environmental sensitive element of the present embodiment is similar to the package 100c of the environmental sensitive element of the fourth embodiment. The package 100h further comprises a second flexible protection layer 170 disposed on the environmental sensitive element 120. The Young's modulus of the second flexible protection layer 170 ranges from about 5 GPa to about 15 GPa, hardness of the second flexible protection layer 170 ranges from about 0.4 GPa to about 1.0 GPa, and water vapor transmittance rate (WVTR) of the second flexible protection layer 170 is less than $10^{-2}$ g/cm$^2$ day, for example.

As shown in FIG. 9, the second flexible protection layer 170 comprises a third protection thin film 172 and a fourth protection thin film 174, wherein the third protection thin film 172 is configure on the top electrode layer T of the environmental sensitive element 120 and the fourth protection thin film 174 is configured on the third protection thin flm 172. It should be noted that, the third protection thin film 172 of the present embodiment is connected to the top electrode layer T, but the four protection thin film 174 is not connected to the top electrode layer T. However, in other embodiments of the present disclosure, the fourth protection thin film 174 disposed on the third protection thin film 172 may be connected to the top electrode layer T.

In the present embodiment, the material of the third protection thin film 172 is similar with the material of the first layer 132 (as shown in Embodiment 1) and the material of the fourth protection thin film 174 is similar with the material of the second layer 134 (as shown in Embodiment 1). In other words, the third protection thin film 172 and the fourth protection thin film 174 are soft or flexible enough to absorb the bending stress so as to protect the environmental sensitive element 120.

In addition, the second flexible protection layer 170 may have a UV cutting function so as to increase the life time of the environmental sensitive element 120. And also the second flexible protection layer 170 may further have a light out coupling function so as to increase the light extraction efficiency of the environmental sensitive element 120.

The Tenth Embodiment

Figure 10:
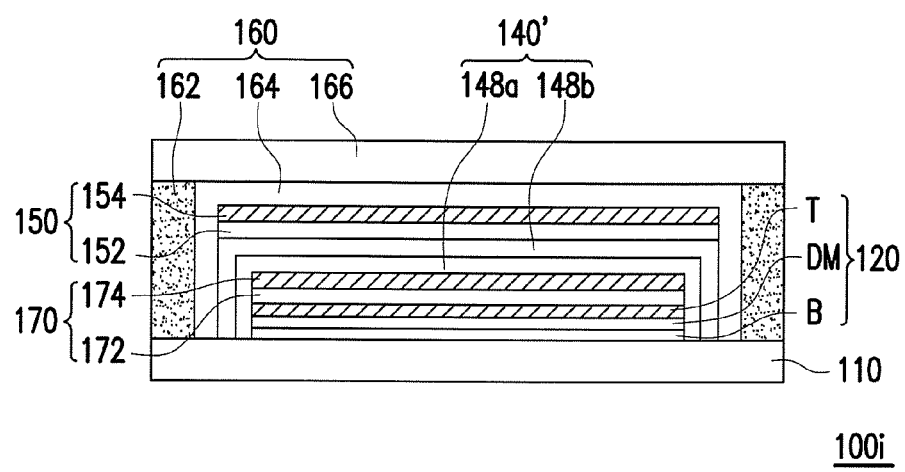
FIG. 10 is the cross-sectional view of a package of an environmental sensitive element according to the tenth embodiment of the present disclosure.

FIG. 10 is the cross-sectional view of a package of an environmental sensitive element according to the tenth embodiment of the present disclosure. As shown in FIG. 10, the package 100i of the environmental sensitive element of the present embodiment is similar to the package 100h of the environmental sensitive element of the ninth embodiment. The package 100i of the environmental sensitive element of the present embodiment further comprises a second packaging structure 160 covering the environmental sensitive element 120, the first packaging structure 140', the first flexible protection layer 150 and the second flexible protection layer 170.

The Eleventh Embodiment

Figure 11:
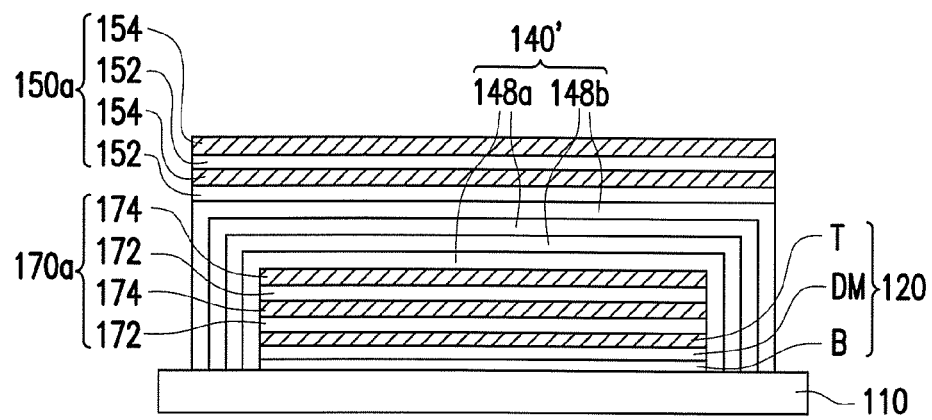
FIG. 11 is the cross-sectional view of a package of an environmental sensitive element according to the eleventh embodiment of the present disclosure.

FIG. 11 is the cross-sectional view of a package of an environmental sensitive element according to the eleventh embodiment of the present disclosure. As shown in FIG. 11, the package 100j of the environmental sensitive element of the present embodiment is similar to the package 100h of the environmental sensitive element of the ninth embodiment. The first flexible protection layer 150a comprises a plurality of first protection thin films 152 and a plurality of second protection thin films 154, wherein the first protection thin films 152 and the second protection thin films 154 are alternately stacked on one another and are configured on the first packaging structure 140' and the bottommost first protection thin film 152 may be connected to the first packaging structure 140'. Moreover, as shown in FIG. 10, the second protection thin films 154 of the present embodiment may be not connected to the first packaging structure 140'.

The second flexible protection layer 170a comprises a plurality of third protection thin films 172 and a plurality of fourth protection thin films 174, wherein the third protection thin films 172 and the fourth protection thin films 174 are alternately stacked on one another and are configured on the environmental sensitive element 120, and the bottommost third protection thin film 172 may be connected to the environmental sensitive element 120. Moreover, as shown in FIG. 10, the fourth protection thin films 174 of the present embodiment may be not connected to the environmental sensitive element 120.

The Twelfth Embodiment

Figure 12:
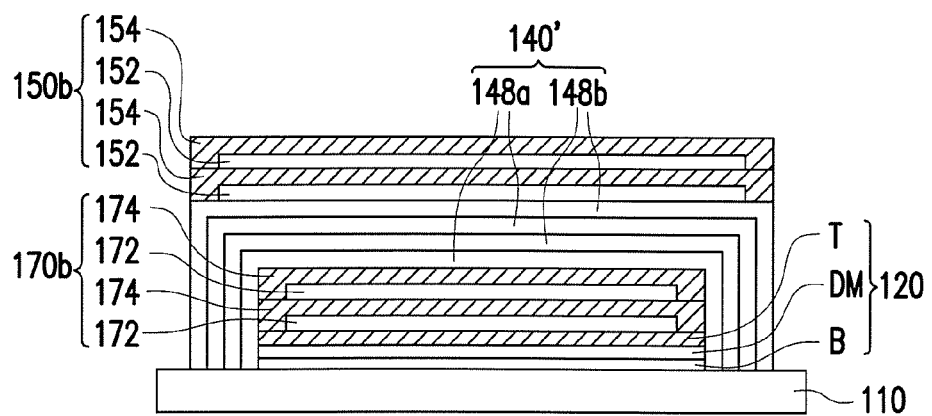
FIG. 12 is the cross-sectional view of a package of an environmental sensitive element according to the twelfth embodiment of the present disclosure.

FIG. 12 is the cross-sectional view of a package of an environmental sensitive element according to the twelfth embodiment of the present disclosure. As shown in FIG. 12, the package 100k of the environmental sensitive element of the present embodiment is similar to the package 100j of the environmental sensitive element of the eleventh embodiment. The bottommost first protection thin film 152 and the bottommost second protection thin film 154 may be connected to the first packaging structure 140'.

Furthermore, the bottommost third protection thin film 172 and the bottommost fourth protection thin film 174 may be connected to the environmental sensitive element 120.

According to the embodiments and the experimental example of the present disclosure, since the encapsulation with various types is formed on the environmental sensitive element, when the environmental sensitive element is exaggeratedly bent, the encapsulation may absorb the bending stress. Therefore, the environmental sensitive element may be prevented from the delaminating phenomenon due to being bent and/or the structure of the environmental sensitive element can be prevented from being damaged during it is bent.

It will be clear that various modifications and variations can be made to the disclosed embodiments. It is intended that the specification and examples be considered as exemplary only, with a true scope of the disclosure being indicated by the following claims and their equivalents.

What is claimed is:

1. A package of an environmental sensitive element, comprising:
    a flexible substrate;
    an environmental sensitive element disposed on the flexible substrate; and
    an encapsulation covering the environmental sensitive element, wherein the Young's modulus of the encapsulation ranges from about 5 GPa to about 15 GPa, hardness of the encapsulation ranges from about 0.4 GPa to about 1.0 GPa, and water vapor transmittance rate (WVTR) of the encapsulation is less than $10^{-2}$ g/cm$^2$ day, wherein the encapsulation comprises a plurality of organic layers and a plurality of inorganic layers stacked alternatively, Young's modulus of the organic layers and/or the inorganic layers ranges from about 5 GPa to about 15 GPa, hardness of the organic layers and/or the inorganic layers ranges from about 0.4 GPa to about 1.0 GPa, and water vapor transmittance rate (WVTR) of the inorganic layers is less than $10^{-2}$ g/cm$^2$ day.

2. The package of claim 1, wherein the encapsulation has UV cutting or light out coupling function.

3. The package of claim 1, further comprising:
    a packaging structure covering the environmental sensitive element and the encapsulation.

4. The package of claim 3, wherein the packaging structure comprises a plurality of organic package thin films and a plurality of inorganic package thin films stacked alternatively to cover the environmental sensitive element and the encapsulation.

5. The package of claim 4, wherein Young's modulus of the organic package thin films and/or the inorganic package thin films ranges from about 5 GPa to about 15 GPa, hardness of the organic package thin films and/or the inorganic package thin films ranges from about 0.4 GPa to about 1.0 GPa, and water vapor transmittance rate (WVTR) of the inorganic package thin films is less than $10^{-2}$ g/cm$^2$ day.

6. A package of an environmental sensitive element, comprising:
    a flexible substrate;
    an environmental sensitive element disposed on the flexible substrate;
    an encapsulation covering the environmental sensitive element, wherein the Young's modulus of the encapsulation ranges from about 5 GPa to about 15 GPa, hardness of the encapsulation ranges from about 0.4 GPa to about 1.0 GPa, and water vapor transmittance rate (WVTR) of the encapsulation is less than $10^{-2}$ g/cm$^2$ day; and
    a packaging structure covering the environmental sensitive element and the encapsulation, wherein the packaging structure comprises a plurality of organic package thin films and a plurality of inorganic package thin films stacked alternatively to cover the environmental sensitive element and the encapsulation, Young's modulus of the organic package thin films and/or the inorganic package thin films ranges from about 5 GPa to about 15 GPa, hardness of the organic package thin films and/or the inorganic package thin films ranges from about 0.4 GPa to about 1.0 GPa, and water vapor transmittance rate (WVTR) of the inorganic package thin films is less than $10^{-2}$ g/cm$^2$ day.

7. The package of claim 6, wherein the encapsulation has UV cutting or light out coupling function.

* * * * *